(12) United States Patent
Zitzlsperger et al.

(10) Patent No.: US 10,886,145 B2
(45) Date of Patent: Jan. 5, 2021

(54) PRODUCTION OF A MULTI-CHIP COMPONENT

(71) Applicant: OSRAM Opto Semiconductors GmbH, Regensburg (DE)

(72) Inventors: Michael Zitzlsperger, Regensburg (DE); Tobias Gebuhr, Regensburg (DE); Stephan Eicher, Arnstorf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/072,993

(22) PCT Filed: Jan. 26, 2017

(86) PCT No.: PCT/EP2017/051681
§ 371 (c)(1),
(2) Date: Jul. 26, 2018

(87) PCT Pub. No.: WO2017/129698
PCT Pub. Date: Aug. 3, 2017

(65) Prior Publication Data
US 2019/0035972 A1 Jan. 31, 2019

(30) Foreign Application Priority Data

Jan. 28, 2016 (DE) .......................... 10 2016 101 526

(51) Int. Cl.
*H01L 21/40* (2006.01)
*H01L 23/495* (2006.01)
(Continued)

(52) U.S. Cl.
CPC ...... *H01L 21/4821* (2013.01); *H01L 21/4846* (2013.01); *H01L 21/4871* (2013.01);
(Continued)

(58) Field of Classification Search
CPC ... H01L 33/0095; H01L 24/48; H01L 33/486; H01L 2224/48465; H01L 2933/0066;
(Continued)

(56) References Cited

U.S. PATENT DOCUMENTS 8,629,549 B2 * 1/2014 Zitzlsperger ........ H01L 23/3107
257/666
8,692,275 B2 * 4/2014 Jaeger ..................... H01L 33/52
257/98

(Continued)

FOREIGN PATENT DOCUMENTS

DE 10 2008 050 972 A1 4/2009
DE 10 2014 101 556 A1 8/2015
(Continued)

*Primary Examiner* — Shouxiang Hu
(74) *Attorney, Agent, or Firm* — DLA Piper LLP (US)

(57) ABSTRACT

A method of producing a surface-mountable multi-chip component includes providing a chip arrangement including a metallic conductor structure exposed at a rear side, a plurality of semiconductor chips and an housing material; and forming a solder stop coating on a rear side of the chip arrangement, wherein the solder stop coating separates connection regions of the conductor structure.

20 Claims, 11 Drawing Sheets

(51) Int. Cl.
| | |
|---|---|
| *H01L 21/48* | (2006.01) |
| *H01L 23/00* | (2006.01) |
| *H01L 23/31* | (2006.01) |
| *H01L 33/62* | (2010.01) |
| *H01L 33/52* | (2010.01) |
| *H01L 21/56* | (2006.01) |
| *H01L 33/00* | (2010.01) |
| *H01L 33/48* | (2010.01) |
| *H01L 25/075* | (2006.01) |

(52) U.S. Cl.
CPC ............ *H01L 21/56* (2013.01); *H01L 21/565* (2013.01); *H01L 23/3107* (2013.01); *H01L 23/495* (2013.01); *H01L 23/49582* (2013.01); *H01L 24/48* (2013.01); *H01L 24/97* (2013.01); *H01L 33/0095* (2013.01); *H01L 33/486* (2013.01); *H01L 33/52* (2013.01); *H01L 33/62* (2013.01); *H01L 25/0753* (2013.01); *H01L 2224/484* (2013.01); *H01L 2224/48465* (2013.01); *H01L 2924/00014* (2013.01); *H01L 2933/005* (2013.01); *H01L 2933/0033* (2013.01); *H01L 2933/0066* (2013.01)

(58) Field of Classification Search
CPC ..... H01L 2924/00014; H01L 2224/484; H01L 2933/005; H01L 25/0753; H01L 2933/0033; H01L 33/62; H01L 23/3107; H01L 24/97; H01L 33/52; H01L 23/49582; H01L 21/56; H01L 21/565; H01L 21/4846; H01L 21/4821; H01L 21/4871; H01L 23/495
See application file for complete search history.

(56) References Cited

U.S. PATENT DOCUMENTS

| | | | |
|---|---|---|---|
| 2005/0045903 A1* | 3/2005 | Abe | H01L 33/54 257/100 |
| 2013/0119426 A1 | 5/2013 | Katoh et al. | |
| 2015/0214129 A1 | 7/2015 | Kawakita et al. | |
| 2017/0077361 A1* | 3/2017 | Brandl | H01L 33/56 |

FOREIGN PATENT DOCUMENTS

| | | | | |
|---|---|---|---|---|
| DE | 102014102810 A1 * | 9/2015 | | H01L 33/56 |
| EP | 0 920 058 B1 | 1/2011 | | |

* cited by examiner

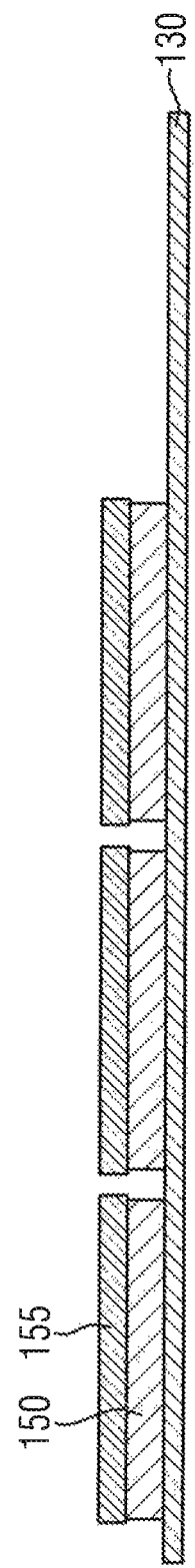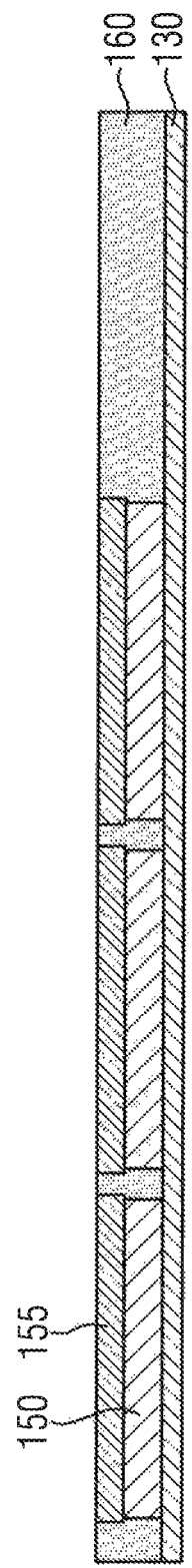

PRODUCTION OF A MULTI-CHIP COMPONENT

TECHNICAL FIELD

This disclosure relates to a method of producing a surface-mountable multi-chip component and a surface-mountable multi-chip component.

BACKGROUND

An electronic component such as, for example, an opto-electronic component that generates light radiation may be realized in the form of a multi-chip component comprising a plurality of semiconductor chips. The component may be a QFN component (Quad Flat No Leads) suitable for surface mounting by soldering. In that design, the component may comprise a conductor structure comprising a plurality of conductor sections on which conductor structure the semiconductor chips and a housing material are arranged. On the rear side, the conductor structure may comprise solderable connection pads (solder pads).

The conductor structure may be constituted of a leadframe, which may be produced by etching a metallic initial layer on both sides. In this case, by different front- and rear-side half-etchings, it is possible to define geometries of mounting and connection pads (chip pads) at the front side, provided for arranging and connecting semiconductor chips, and of connection pads at the rear side, provided for soldering. Parts of the leadframe may be separated from one another by a complete through-etching such that the parts may serve, for example, as cathode and anode.

Depending on the requirement, the leadframe may have a different thickness. A large thickness of the leadframe facilitates, for example, thermal management during operation of the multi-chip component. In such a configuration, deep and wide etching trenches are produced during patterning of the underlying initial layer. This has the consequence that the semiconductor chips may be arranged only at large distances from one another. By contrast, to enable close positioning of the semiconductor chips, a thin leadframe is required. The thickness of the leadframe or of the initial layer defines the minimum width of etching trenches, and thus the minimum possible distance between the front-side mounting pads and the semiconductor chips arranged thereon.

However, the use of a thin leadframe adversely affects the handling thereof in a production method. A further requirement is to make the distance between the rear-side connection pads as large as possible in contrast to the front-side mounting pads, thereby avoiding a short circuit during surface mounting. Large-area undercutting of the mounting pads, which may be provided for this purpose, makes chip mounting more difficult.

It could therefore be helpful to provide an improved method of producing a surface-mountable multi-chip component and an improved surface-mountable multi-chip component.

SUMMARY

We provide a method of producing a surface-mountable multi-chip component including providing a chip arrangement including a metallic conductor structure exposed at a rear side, a plurality of semiconductor chips and an housing material; and forming a solder stop coating on a rear side of the chip arrangement, wherein the solder stop coating separates connection regions of the conductor structure.

We also provide a surface-mountable multi-chip component including a conductor structure accessible at a rear side, a plurality of semiconductor chips, a housing material and a solder stop coating formed at the rear side, wherein the solder stop coating separates connection regions of the conductor structure.

We further provide a method of producing a surface-mountable multi-chip component including providing a chip arrangement including a metallic conductor structure exposed at a rear side, a plurality of semiconductor chips and an housing material; and forming a solder stop coating on the rear side of the chip arrangement, wherein the solder stop coating separates connection regions of the conductor structure, wherein the multi-chip component is produced such that the connection regions comprise a distance of more than 100 µm and the semiconductor chips include a distance of less than 100 µm, and providing the chip arrangement includes providing a metallic initial layer; arranging the semiconductor chips on the initial layer; applying the housing material on the initial layer; and forming the conductor structure after arranging the semiconductor chips and applying the housing material by producing cutouts severing the initial layer.

BRIEF DESCRIPTION OF THE DRAWINGS

FIGS. 1 to 4 show one possible method sequence of producing a multi-chip component on the basis of lateral sectional illustrations, wherein semiconductor chips are arranged on a metallic initial layer, a housing material is applied on the initial layer, cutouts are produced in the initial layer to form a conductor structure, and a solder stop coating is formed on the rear side, the solder stop coating separating connection regions of the conductor structure.

LIST OF REFERENCE SIGNS

Figure 3:
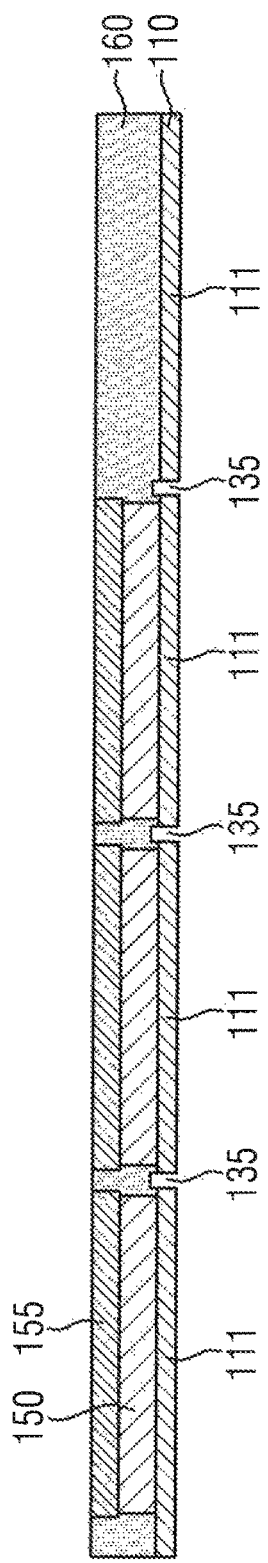

101, 102 Component
103, 104 Component
105 Component
110 Conductor structure
111 Conductor section
115 Connection web
121 Connection region
130 Initial layer
131, 132 Depression
135, 136 Cutout 140 Leadframe
150 Semiconductor chip
155 Conversion element
157 Bond wire
160 Housing material
170 Solder stop coating
190 Separating line

DETAILED DESCRIPTION

Our method comprises providing a chip arrangement. The chip arrangement comprises a metallic conductor structure exposed at a rear side, a plurality of semiconductor chips and a housing material. The method furthermore comprises forming a solder stop coating on the rear side of the chip arrangement provided. The solder stop coating separates connection regions of the conductor structure.

The multi-chip component produced with the aid of the method may be a QFN component (Quad Flat No Leads). The solder stop coating formed at the rear side of the component, the rear side being provided for surface mounting, may bring about an electrical insulation between the connection regions present at the rear side and constituted of the conductor structure. The connection regions, which may be exposed surface regions of the conductor structure, may comprise a relatively large distance with respect to one another on account of the solder stop coating. Therefore, during surface mounting of the component by soldering it is possible to prevent a situation in which a plurality of the rear-side connection regions are jointly covered or wetted with a solder and thereby short-circuited. The semiconductor chips, which like the housing material may be arranged on the conductor structure, may be positioned at a smaller or at a relatively small distance from one another.

A description is given below of further possible examples and details which may be considered for the method and the multi-chip component produced according to the method.

The multi-chip component may be produced together with further multi-chip components embodied structurally identically in an assemblage. In this case, the chip arrangement may be provided with corresponding dimensions and numbers of component parts of the plurality of components fabricated as an assemblage. The solder stop coating subsequently formed on the rear side of the chip arrangement may separate the connection regions of all the components. The component assemblage constituted in this way and comprising the solder stop coating may subsequently be singulated into separate components. The following description relating principally to the production of an individual multi-chip component may be applied to all the components produced jointly in the assemblage.

The conductor structure may be partly covered with the solder stop coating during the process of forming the solder stop coating. In this example, distances and/or dimensions of the rear-side connection regions of the multi-chip component may be defined with the aid of the solder stop coating. As a result, large distances between the connection regions may be realized in a simple manner to prevent an occurrence of a short circuit during surface mounting of the component.

In this context, consideration may furthermore be given to the following example in which the solder stop coating, relative to a rear-side view, is formed with a shape enclosing the connection regions. By way of example, the solder stop coating may be produced with a grid shape. In this way, too, it is possible to realize large distances between the rear-side connection regions.

The multi-chip component may be produced, for example, such that the rear-side connection regions comprise a distance of more than 100 µm, for example, a distance of a plurality of 100 µm. One possible example is a distance of 300 µm. This configuration promotes reliable surface mounting of the component without the occurrence of a short circuit. A distance of less than 100 µm, for example, of 50 µm may be provided for the semiconductor chips.

The conductor structure of the chip arrangement provided may comprise corresponding conductor sections as explained in even greater detail further below. The conductor sections, which may be partly covered with the solder stop coating during the process of forming the solder stop coating, may constitute the rear-side connection regions.

The solder stop coating may comprise a material not wettable with a solder. In this way, locations covered with the solder stop coating may be protected against wetting with a solder. This property promotes reliable surface mounting of the multi-chip component without the occurrence of a short circuit.

The solder stop coating may comprise a plastics material. In one configuration, the solder stop coating comprises a solder stop resist (solder resist). The solder stop resist may, for example, be an epoxy resin or comprise an epoxy resin. The solder stop coating may also comprise some other plastics material such as, for example, a silicone material or polyimide.

Forming the solder stop coating may comprise printing material of the solder stop coating on the rear side of the chip arrangement provided. In this case, the material of the solder stop coating may be printed in a structure predefined for the solder stop coating. By virtue of the printing, which may be considered in a configuration of the solder stop coating comprising a solder stop resist, for example, the method may be carried out simply and cost-effectively. It is possible, for example, to carry out a screen printing method or a stencil printing method.

Forming the solder stop coating may comprise areally applying material of the solder stop coating on the rear side of the chip arrangement provided and subsequent patterning such that the solder stop coating is produced with a predefined structure. In this case, a configuration of the solder stop coating comprising a photosensitive or photopatternable material such as a solder stop resist, for example, may be considered. The material or the solder stop resist may be applied areally, for example, by printing and then be patterned by selective exposure and subsequent development. Patterning may also be carried out in some other way, for example, by etching using a suitable etching or photoresist mask.

Furthermore, forming the solder stop coating may be carried out such that the solder stop coating or material of the solder stop coating is applied in the form of a film on the rear side of the chip arrangement provided. By way of example, laminating the film is possible. The film may comprise one of the materials mentioned above. Furthermore, the film may be provided with a structure and shape predefined for the solder stop coating, or may be provided in an unpatterned form and brought to such a shape before being applied on the chip arrangement. Applying an unpatterned film followed by patterning the film after applying is also possible. In one possible configuration of the film comprising a photosensitive or photopatternable material, for example, the patterning, as indicated above, may be carried out by selective exposure and subsequent development. Patterning in some other way is also possible, for example, by etching with the aid of an etching mask.

The multi-chip component produced with the aid of the method may be an optoelectronic component. In this example, the semiconductor chips of the chip arrangement provided are optoelectronic semiconductor chips. The optoelectronic semiconductor chips may be configured to generate electromagnetic radiation or light radiation. By way of example, light emitting diode chips or LED chips may be used as radiation emitting semiconductor chips.

With the use of radiation emitting semiconductor chips, the close positioning of the semiconductor chips affords the possibility of emitting radiation during operation of the multi-chip component with a high homogeneity. This is the case, for example, with the abovementioned chip-to-chip distance of less than 100 μm.

The semiconductor chips may comprise a front-side contact and a rear-side contact. In this case, the chip arrangement may be provided such that the semiconductor chips are arranged on the conductor structure with the aid of the rear-side contact, and connect to the conductor structure at this location via an electrically conductive connection material, for example, an electrically conductive adhesive or a solder. The front-side contact of the semiconductor chips may connect to the conductor structure via a bond wire.

In one configuration of the multi-chip component as a radiation emitting component, consideration may be given to at least partly converting the radiation emitted by the semiconductor chips. As a result, it is possible to generate a light radiation with a predefined color and a predefined color locus, for example, a white light radiation. For this purpose, the chip arrangement may be provided with a suitable conversion material.

The chip arrangement may be provided, for example, such that a respective conversion element for radiation conversion is arranged on the semiconductor chips. Therefore, the chip arrangement provided may comprise a plurality of chip stacks arranged on the conductor structure and each comprising a semiconductor chip and a conversion element arranged thereon.

Providing the chip arrangement may be carried out such that the housing material is arranged on the conductor structure and adjoins the semiconductor chips. If the chip arrangement comprises chip stacks comprising a semiconductor chip and a conversion element, the housing material may be formed in a manner adjoining the chip stacks. The housing material may furthermore be formed such that the housing material laterally encloses the semiconductor chips or chip stacks. Moreover, the housing material may be formed in a manner extending as far as front sides of the semiconductor chips or chip stacks such that the front sides may be exposed and used for radiation emission. By virtue of the housing material, the multi-chip component may comprise a high mechanical stability.

The housing material may be a plastics material or comprise a plastics material. Possible examples are an epoxy material or a silicone material. Embedded therein, the housing material may furthermore comprise, for example, scattering particles and/or a further filler. On account of the scattering particles, the housing material may comprise a white color.

Providing the chip arrangement may comprise providing a metallic initial layer, arranging the semiconductor chips on the initial layer, and applying the housing material on the initial layer. Provision is furthermore made to form the conductor structure by producing cutouts severing the initial layer. Forming the conductor structure is carried out after arranging the semiconductor chips and applying the housing material. The conductor structure constituted in this way may comprise conductor sections, between which the cutouts are present.

The method steps mentioned above may be carried out in the order indicated. Arranging the semiconductor chips on the initial layer may comprise, alongside mounting or securing the semiconductor chips on the initial layer, which may be carried out by adhesive bonding or soldering, for example, connecting bond wires to front-side contacts of the semiconductor chips and the initial layer. If provided, conversion elements may furthermore be arranged or adhesively bonded on the semiconductor chips such that corresponding chip stacks are provided on the initial layer. Subsequently applying the housing material on the initial layer may be carried out such that the housing material, as indicated above, is formed in a manner adjoining the semiconductor chips or chip stacks. This may be realized as follows.

By way of example, applying the housing material on the initial layer provided with the semiconductor chips or chip stacks may be carried out with the aid of a molding process, also referred to as mold process. In this example, the housing material may be referred to as a molding compound (mold compound). The molding process may be carried out with the aid of a molding or mold tool comprising a suitable cavity structure. For the molding process, the initial layer provided with the semiconductor chips or chip stacks may be received in the molding tool, and the molding compound may be applied with a predefined mold on the initial layer with the aid of the cavity structure.

The molding process may be a transfer molding process. A transfer molding tool is used in this case. During transfer molding, the molding compound may be pressed into the cavity structure of the transfer molding tool with the aid of a ram.

It is possible, for example, to carry out a film assisted transfer molding (FAM) process. In this case, a film comprising a plastics material may be arranged on a tool part of the transfer molding tool. In the transfer molding process, the relevant tool part with the film may be pressed onto front sides of the semiconductor chips or chip stacks. In this way, the molding compound may be formed in a manner extending to the semiconductor chips or chip stacks, and the front sides thereof may be reliably prevented from being covered with the molding compound.

Applying the housing material on the initial layer provided with the semiconductor chips or chip stacks may be carried out by potting. In this example, the housing material may be referred to as potting material. In this case, before or after the process of arranging the semiconductor chips, a frame, also referred to as a dam, may be formed on the initial layer, and the region enclosed by the frame may be filled with the potting material. In this way, the potting material may be formed in a manner extending to the semiconductor chips or chip stacks. The front sides thereof may be prevented from being covered in this case, too. The frame may be formed on the initial layer, for example, with the aid of a molding or transfer molding process. It is also possible for the frame to be fabricated separately and arranged on the initial layer.

The abovementioned process of forming cutouts in the initial layer for the purpose of forming the conductor structure may be carried out in various ways. By way of example, etching is possible, which may be carried out with the aid of an etching or photoresist mask produced beforehand on the initial layer. Further processes are mechanical patterning by, for example, sawing or else laser cutting. Depending on the process, not just the initial layer may be severed, but if appropriate a part of the housing material in the region of the initial layer may also be severed or removed.

The conductor structure constituted of producing the cutouts, the conductor structure carrying the semiconductor chips, comprises corresponding conductor sections. The latter may be separate conductor sections. With regard to fabrication of a plurality of multi-chip components as an assemblage, separate conductor sections assigned only to the respective components may be formed in a corresponding manner by producing the cutouts severing the initial layer.

A further method variant, which may be considered for the fabrication of a plurality of multi-chip components as an assemblage, consists of forming conductor sections assigned to a plurality of components by producing the cutouts severing the initial layer. In the context of singulating the component assemblage, the conductor sections may be severed and only thereby obtain the shape provided for the individual multi-chip components.

The use of the metallic initial layer patterned after arranging semiconductor chips and applying the housing material by producing cutouts into the conductor structure affords the following advantages.

The initial layer may be closed during the process of applying the housing material in the region of the semiconductor chips. This makes it possible to prevent the housing material applied as molding compound or potting material from being able to reach the rear side of the initial layer and thus contaminate the initial layer and the connection regions. Rear-side contaminations of this type, which possibly occur when a leadframe is used and are also referred to as mold compound bleed or seepage, may thus be avoided.

Furthermore, the semiconductor chips may be arranged on the unpatterned initial layer and thus on solid material. Reliable chip mounting is possible as a result.

The procedure of patterning the initial layer only after arranging the semiconductor chips and applying the housing material furthermore makes it possible to provide the initial layer with a relatively small thickness. When the cutouts severing the initial layer are produced by an etching process, the possibility of forming the cutouts with a small width is afforded in this way.

A further advantage of a small thickness of the initial layer is that the mechanical stress based on different coefficients of thermal expansion may be significantly lower when soldering semiconductor chips on the initial layer compared with soldering semiconductor chips on a leadframe comprising a large thickness. In the same way, a smaller warpage of the semiconductor chips (chip warpage) may occur, as a result of which the risk of detachment of conversion elements (if present) arranged on the semiconductor chips and a color locus shift (color shift) associated therewith may be reduced.

The advantages mentioned above may be clearly manifested in a further example, in which the initial layer provided comprises a thickness of less than 150 µm. The initial layer may comprise, for example, a thickness of 100 µm or even less.

In a further example, the rear side of the chip arrangement during the process of forming the solder stop coating is covered with the solder stop coating at least in the region of the cutouts. This example, in which the cutouts may be filled with the solder stop coating, promotes a reliable electrical insulation between the rear-side connection regions.

The initial layer provided may comprise depressions at a front side or at a rear side. The depressions may be produced by an etching process. The depressions may be half-etchings. The cutouts that form the conductor structure may be formed in the region of such depressions. A simple and rapid process of forming the cutouts may be made possible in this way.

Rear sides of semiconductor chips may be exposed in a partial region by producing the cutouts severing the initial layer and are subsequently covered with the solder stop coating. The solder stop coating may be introduced into the cutouts for this purpose. In this example, too, the semiconductor chips may be positioned at a small distance from one another. With the aid of the cutouts, which may be relatively wide, it is possible to realize by contrast large distances between the conductor sections and thus between the rear-side connection regions.

Providing the chip arrangement may comprise providing a metallic leadframe constituting the conductor structure, arranging the semiconductor chips on the leadframe, and applying the housing material on the leadframe. These method steps may be carried out in the order indicated. To arrange the semiconductor chips and apply the housing material on the leadframe, details that have been explained above in association with the use of a metallic initial layer may be applied correspondingly.

By way of example, arranging the semiconductor chips may comprise, alongside mounting or securing the semiconductor chips on the leadframe, which may be carried out by adhesive bonding or soldering, for example, connecting bond wires to front-side contacts of the semiconductor chips and to the leadframe. If provided, conversion elements may be arranged or adhesively bonded on the semiconductor chips such that corresponding chip stacks are provided on the leadframe.

The subsequent process of applying the housing material on the leadframe, in which the housing material, as indicated above, may be formed in a manner adjoining the semiconductor chips or chip stacks, may be carried out, for example, with the aid of a molding process, for example, a transfer molding process. In this case, the leadframe provided with the semiconductor chips or chip stacks may be received in a molding tool, and the molding compound may be applied with a predefined shape on the leadframe. Furthermore, a film assisted transfer molding process may be carried out. In this case, a film comprising a plastics material may be arranged on a tool part of the transfer molding tool, with which film the relevant tool part may be pressed onto front sides of the semiconductor chips or chip stacks.

The leadframe may comprise a plurality of conductor sections and connection webs connecting the conductor sections. With regard to fabrication of a plurality of multi-chip components as an assemblage, merely the conductor sections of different components may be connected via the connection webs. In the context of singulating the component assemblage, the connection webs may be severed such that the conductor sections of the individual components are no longer connected by material of the leadframe and no longer short-circuited as a result.

The solder stop coating may be formed in the form of a continuous coating on the rear side of the chip arrangement provided. In this case, the solder stop coating, as indicated above, may be formed with a shape enclosing the connection regions, for example, with a grid shape. This also applies to production of a plurality of multi-chip components as an assemblage. During singulating, the solder stop coating may be severed such that the solder stop coating at the individual components still comprises a continuous structure or structure enclosing the connection regions, for example, a grid-shaped structure.

It is also possible to form a non-continuous solder stop coating on the rear side of the chip arrangement provided, which comprises a plurality of separate partial sections. During singulation, the partial sections may be severed. A multi-chip component constituted in this way may comprise a solder stop coating subdivided into separate partial sections, wherein the partial sections of the solder stop coating may be arranged between rear-side connection regions and may separate the latter. Such a configuration may also be realized by a solder stop coating initially formed in a continuous fashion being severed during singulating such that a multi-chip component comprises a solder stop coating comprising separate partial sections.

We also provide a surface-mountable multi-chip component. The component comprises a conductor structure accessible at a rear side, a plurality of semiconductor chips, a housing material and a solder stop coating formed at the rear side. The solder stop coating separates connection regions of the conductor structure.

The multi-chip component may be produced in accordance with the method explained above or in accordance with one or more of the above-described examples of the method. For the component, configurations that may be possible and advantages that may be considered are the same as those that have been explained above with regard to the method.

By way of example, the solder stop coating may bring about an electrical insulation between the rear-side connection regions, and the connection regions may comprise a relatively large distance with respect to one another on account of the solder stop coating. Consequently, surface mounting of the component may be carried out without a short circuit of connection regions. The semiconductor chips, which like the housing material may be arranged on the conductor structure, may be positioned relatively near to one another.

Furthermore, by way of example, individual or a plurality of configurations from among the following configurations may be present. The conductor structure of the multi-chip component may comprise a plurality of separate conductor sections. Cutouts may be located between the conductor sections. The cutouts may be formed in the region of depressions of the conductor structure. The solder stop coating may partly cover the conductor structure or the conductor sections. The solder stop coating may comprise a shape enclosing the connection regions. The solder stop coating may comprise a solder stop resist. The multi-chip component may be an optoelectronic component, and the semiconductor chips may be optoelectronic semiconductor chips configured for generating radiation, for example. A respective conversion element for radiation conversion may be arranged on the semiconductor chips, as a result of which the multi-chip component may comprise corresponding chip stacks comprising a semiconductor chip and a conversion element. The semiconductor chips may be electrically connected in series. The semiconductor chips may be arranged on the conductor structure. The housing material may be arranged on the conductor structure and adjoin the semiconductor chips or chip stacks. In this case, front sides of the semiconductor chips or chip stacks may be exposed. The connection regions may comprise a distance of more than 100 µm, and the semiconductor chips may comprise a distance of less than 100 µm.

The advantages and developments explained above may be applied individually or else in arbitrary combination with one another—apart, for example, in cases of clear dependencies or incompatible alternatives.

The above-described properties, features and advantages and the way in which they are achieved will become clearer and more clearly understood in association with the following description of examples explained in greater detail in association with the schematic drawings.

Possible configurations of a method of producing a surface-mountable multi-chip component realized in the form of a QFN package (Quad Flat No Leads) are described with reference to the following schematic figures. In the method, processes known from semiconductor technology and the fabrication of electronic components may be carried out and routine materials in these fields may be used, and so they will be discussed only in part. In the same way, in addition to processes shown and described, further processes may be carried out and the components may be fabricated with further component parts and structures in addition to component parts shown and described. Furthermore, the figures are merely schematic in nature and are not true to scale. In this sense, component parts and structures shown in the figures may be illustrated with exaggerated size or size reduction to afford a better understanding.

The method is used for the parallel production of a multiplicity of structurally identical multi-chip components. In this case, a continuous component assemblage is fabricated and then singulated into separate components. In this sense, in part the figures show an excerpt from the fabrication assemblage in the region of one of the components produced, and conditions shown here are present in a multiply repeating fashion in the assemblage. The following description applies to all of the components fabricated as an assemblage.

Figure 5:
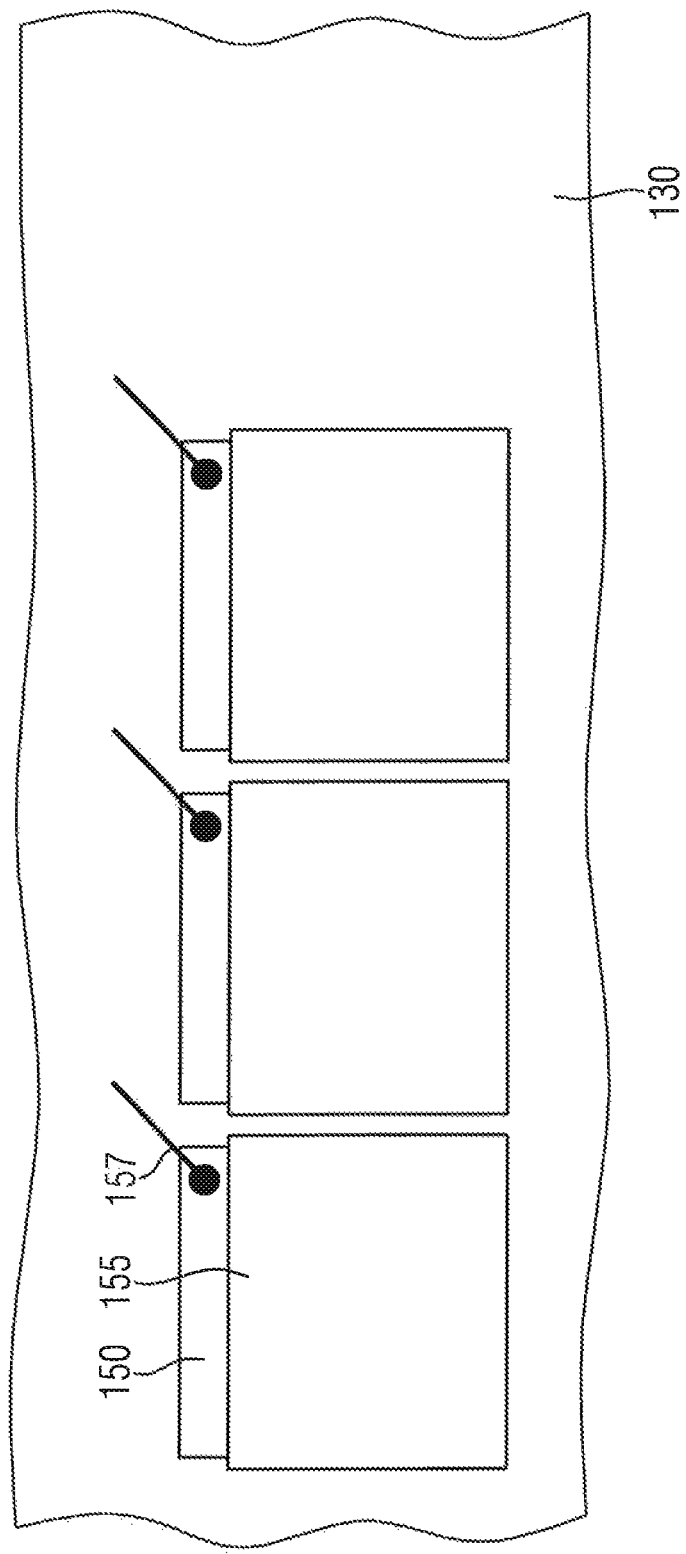
FIGS. 5 to 7 show steps of the method sequence in a front-side view.
Figure 6:
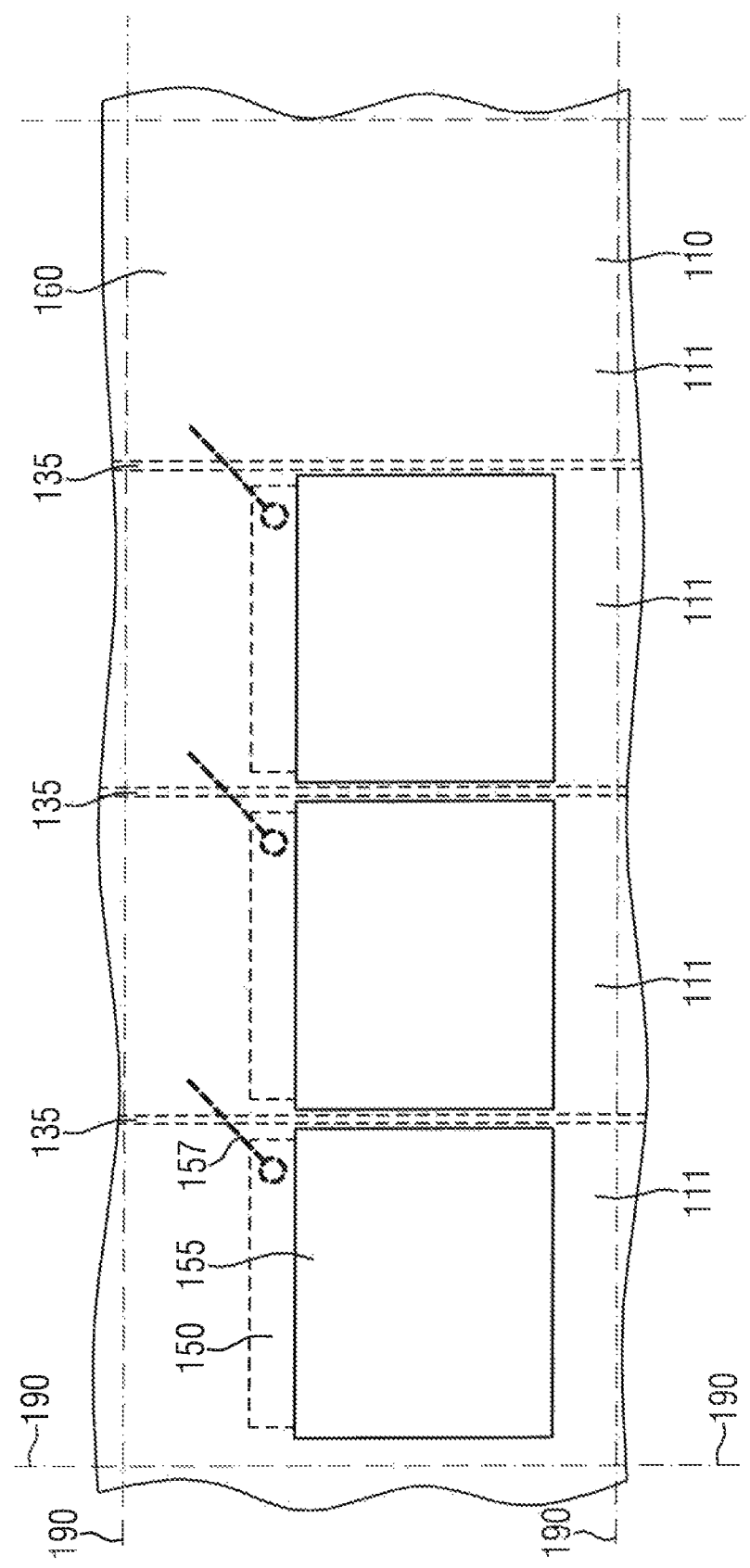
Figure 7:
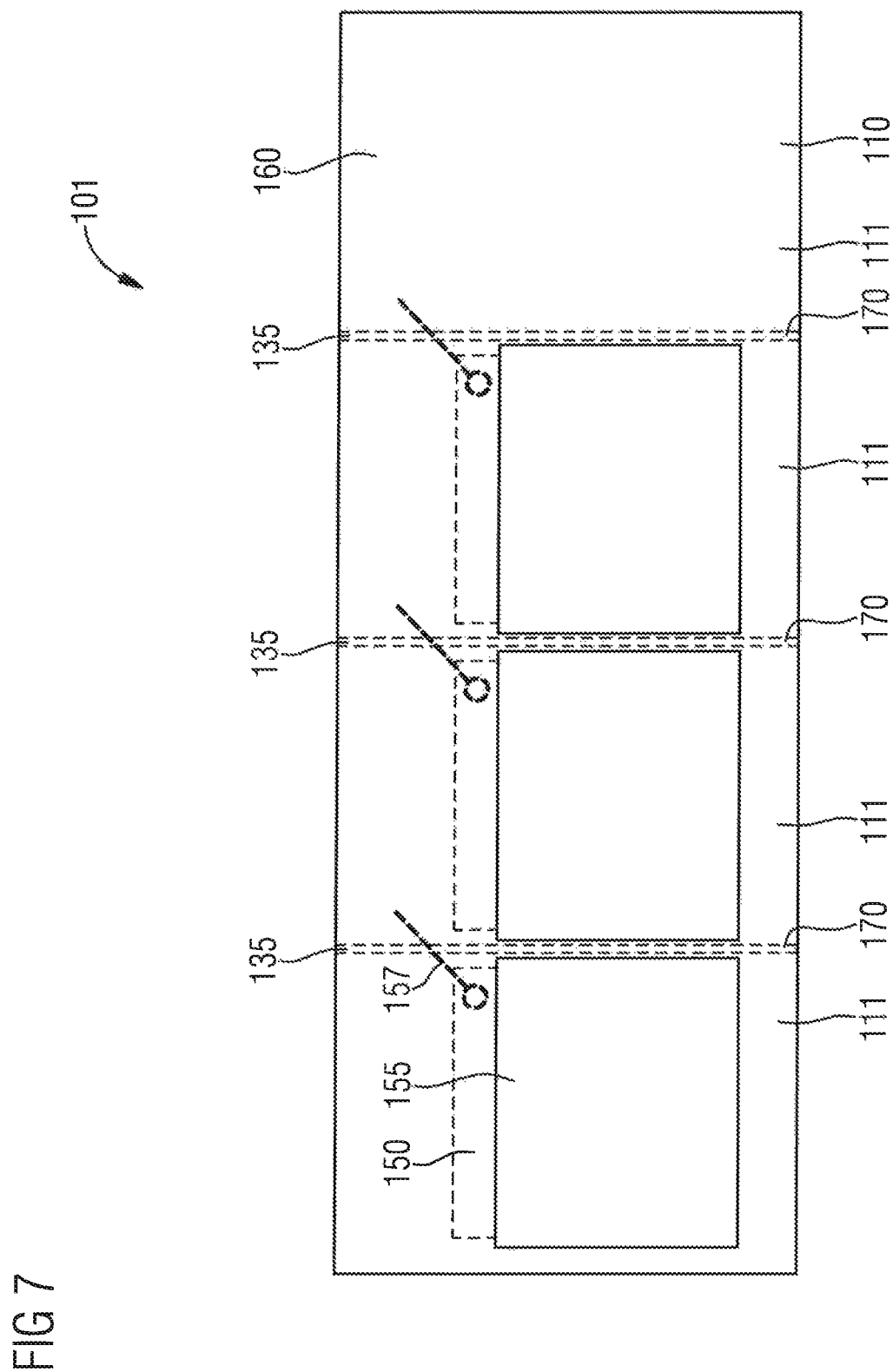

FIGS. 1 to 4 show, on the basis of lateral sectional illustrations, one possible method of producing a surface-mountable multi-chip component 101, comprising a plurality of semiconductor chips 150. Supplementarily, FIGS. 5 to 7 illustrate conditions in a front-side view, and FIGS. 8 and 9 in a rear-side view. The multi-chip component 101 is an optoelectronic component for emitting light radiation. Accordingly, the semiconductor chips 150 are optoelectronic semiconductor chips configured for generating radiation.

Figure 4:
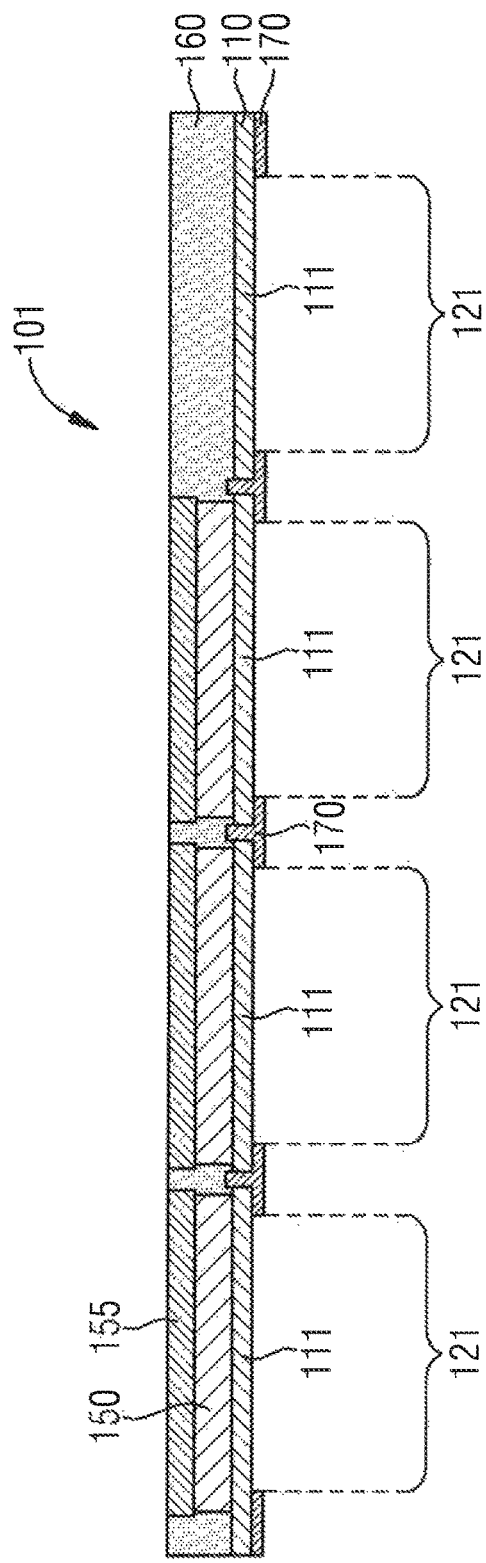

In the course of the method, a chip arrangement shown in FIG. 3 and comprising a metallic conductor structure 110 exposed at a rear side is provided, and a solder stop coating 170 is then formed on the rear side as shown in FIG. 4. In this case, the conductor structure 110 is formed by patterning a metallic initial layer 130 as explained in greater detail below.

At the beginning of the method, a metallic initial layer 130 is provided on which, as illustrated in cross section in FIG. 1 and in a front-side view in FIG. 5, a plurality of semiconductor chips 150 are arranged on the front side. The semiconductor chips 150 may comprise a thickness of 120 µm. In the configuration shown here, the multi-chip component 101 is produced with three semiconductor chips 150. The semiconductor chips 150 are furthermore positioned in a row alongside one another and at relatively small distances from one another. The distance between two adjacent semiconductor chips 150 may be less than 100 µm, for example, 50 µm.

The metallic initial layer 130 may be a copper layer, for example. Furthermore, the initial layer 130 may comprise a metallic coating (not shown) as a result of which the initial layer 130 is solderable and suitable to connect bond wires 157. The initial layer 130 is unpatterned at least in the region of the semiconductor chips 150 such that the semiconductor chips 150 are arranged on solid material of the initial layer 130. Reliable chip mounting is possible in this way.

As has been indicated above, the semiconductor chips 150 are optoelectronic radiation emitting semiconductor chips. By way of example, a configuration in the form of light emitting diode chips or LED chips is possible.

The semiconductor chips 150 comprise a front-side contact and a rear-side contact (not illustrated). In the course of arranging the semiconductor chips 150 on the initial layer 130 the semiconductor chips 150 electrically and mechanically connect to the initial layer 130 via the rear-side contact and an electrically conductive connection layer (not shown), for example, a solder layer or a layer of an electrically conductive adhesive. Afterward, the front-side contacts of the semiconductor chips 150 as shown in FIG. 5, connect to the initial layer 130 via bond wires 157.

Furthermore, as illustrated in FIGS. 1 and 5, a laminar conversion element 155 for radiation conversion is provided on each semiconductor chip 150 such that a plurality of chip stacks, or three chip stacks, each comprising a semiconductor chip 150 and a conversion element 155 are provided on the initial layer 130. The conversion elements 155 are configured to convert a primary light radiation generated by the semiconductor chips 150 at least partly into one or more secondary light radiations. By way of example, a white light radiation may be generated in this way. The conversion elements 155 may be secured on front sides of the semiconductor chips 150 using a transparent adhesive (not shown). Arranging the conversion elements 155 on the semiconductor chips 150 may be carried out before or after connecting the bond wires 157.

The conversion elements 155 comprise such dimensions or are arranged on the semiconductor chips 150 such that the front-side contacts of the semiconductor chips 150 are not covered by the conversion elements 155.

With regard to production of a plurality of multi-chip components 101 as an assemblage, the chip mounting in the configuration is carried out such that for each component 101 three chip stacks comprising a semiconductor chip 150 and a conversion element 155 in accordance with FIGS. 1 and 5 are provided on the metallic initial layer 130.

Afterward, as shown in cross section in FIG. 2 and in a front-side view in FIG. 6, a housing material 160 is applied on the initial layer 130 equipped with the chip stacks. The housing material 160 encloses the chip stacks and extends as far as front sides of the chip stacks, which in this case are constituted of the conversion elements 155. As a result, the front sides of the chip stacks may still be used to emit radiation. The bond wires 157, as is indicated in FIG. 6, may be completely embedded in the housing material 160.

Applying the housing material 160 may comprise, for example, carrying out a transfer molding process involving the use of a transfer molding tool (not shown) comprising a suitable cavity structure. In this case, the housing material 160 may be referred to as a molding compound (mold compound). For this process, the initial layer 130 provided with the chip stacks is received in the molding tool, and the housing material 160 is injected into the cavity structure with the aid of a ram.

The transfer molding process may be a film assisted transfer molding (FAM, Film Assisted Transfer Molding) process. In this case, a film for sealing is arranged on a tool part of the transfer molding tool. In the transfer molding process, the tool part with the film is pressed onto the chip stacks or onto the front-side conversion elements 155. What may reliably be achieved as a result is that the housing material 160 is applied on the initial layer 130 without covering the front sides of the chip stacks.

The housing material 160 may comprise a plastics material, for example, an epoxy material or silicone material. Furthermore, the housing material 160 may comprise (not illustrated) at least one further material contained in the plastics material, for example, an inorganic filler material. This may involve scattering particles comprising TiO2, for example, as a result of which the housing material 160 may comprise a white color. If appropriate, the plastics material may also contain at least one colorant, as a result of which the housing material may comprise a different color. The use of carbon black is possible, for example, to provide a black color.

With regard to production of a plurality of multi-chip components 101 as an assemblage, the housing material 160 applied on the initial layer 130 extends over the regions of all of the components 101 produced in the assemblage.

Afterward, at the rear side of the chip arrangement present after applying the housing material 160 as shown in FIG. 3 and is also indicated in FIG. 6, linear cutouts 135 are produced, which sever the metallic initial layer 130. A conductor structure 110 comprising a plurality of conductor sections 111, between which the cutouts 135 are located, is provided in this way. In the front- or rear-side view, the cutouts 135 extend in a direction parallel to one another and in regions alongside or between the semiconductor chips 150.

Producing the cutouts 135 may be carried out mechanically, for example, by sawing. A further possible procedure is severing the initial layer 130 with the aid of a laser. With the application of such processes, the cutouts 135 produced may partly extend into the housing material 160 as indicated in FIG. 3. Alternatively, the cutouts 135 may be produced by etching on the rear side using an etching or photoresist mask formed beforehand on the initial layer 130. In this way, in a departure from FIG. 3, just the initial layer 130 may be severed.

With regard to production of a plurality of multi-chip components 101 as an assemblage, FIG. 6 supplementarily indicates separating lines 190, along which the component assemblage is singulated at the end of the method and the multi-chip component 101 shown is thus separated from other components 101. Furthermore, a configuration is indicated in which the cutouts 135 are not delimited to the geometric region of one component 101, but rather extend over a plurality of components 101. Therefore, the conductor sections 111 are also initially still assigned to a plurality of components 101. In the context of singulating the component assemblage, the conductor sections 111 are severed and thus first obtain their final geometric shape provided in the components 101.

The chip arrangement present after producing the cutouts 135 and comprising the conductor structure 110 is subsequently provided with a solder stop coating 170 on the rear side as shown in cross section in FIG. 4 and in a rear-side view in FIG. 8. The solder stop coating 170 comprises a grid shape. In this case, a part of the conductor structure 110 is covered with the solder stop coating 170, while rear-side surface regions 121 of the conductor sections 111 of the conductor structure 110, which are enclosed by the solder stop coating 170 in the rear-side view, are exposed. The solder stop coating 170 is formed in the region of the cutouts 135 such that the cutouts 135 are filled with the solder stop coating 170 and the solder stop coating 170 covers the conductor structure 110 laterally with respect to the cutouts 135. On account of the grid shape, the solder stop coating 170 is furthermore formed in other regions outside and between the cutouts 135 on the conductor structure 110.

The exposed regions 121, with the aid of which surface mounting of the finished multi-chip component 101 may be carried out, are referred to hereinafter as connection regions 121 or connection pads 121. A configuration comprising four connection regions 121 arranged alongside one another in a row in a manner corresponding to the semiconductor chips 150 on the opposite side is provided for the multi-chip component 101 shown.

The lateral shapes and dimensions, and also the distances of the rear-side connection regions 121 of the multi-chip component 101, in the method sequence, are defined with the aid of the solder stop coating 170 partly covering the conductor structure 110. As a result, as shown in FIG. 4, it is possible to realize distances between the connection regions 121 larger than distances between the semiconductor chips 150. By way of example, adjacent connection regions 121 may comprise a distance of more than 100 µm, for example, a distance of 300 µm.

The solder stop coating 170 is formed from a material that is not wettable with a solder. In this way, wetting with a solder may be prevented at locations masked with the solder stop coating 170. By way of example, a configuration of the solder stop coating 170 comprising a solder stop resist may be considered in this context. The resist may be an epoxy resin or comprise an epoxy resin.

The solder stop coating 170 may also be formed from a different material or plastics material. The latter includes, for example, a silicone material or polyimide.

Applying the solder stop coating 170 on the underside of the chip arrangement may comprise carrying out a printing method, for example. In this case, the solder stop coating 170 may be printed with the structure shown in FIGS. 4 and 8. By way of example, it is possible to carry out a screen printing method or a stencil printing method.

A further possible procedure of forming the solder stop coating 170 consists of material of the solder stop coating 170 first being applied over a large area on the rear side of the chip arrangement, for example, by printing, and then being patterned. In this context, by way of example, a photosensitive solder stop resist may be used, and the patterning that provides the desired shape of the solder stop coating 170 may be carried out by selective exposure and subsequent development.

Depending on the used material of the solder stop coating 170, the patterning may also be carried out in some other way. By way of example, etching using a suitable etching or photoresist mask is possible.

Furthermore, consideration may be given to applying the solder stop coating 170 or material of the solder stop coating 170 in the form of a film on the rear side of the chip arrangement, for example, by laminating. The film may be formed from one of the materials mentioned above. The film may be provided such that the film already comprises a structure corresponding to FIGS. 4 and 8 before being applied on the chip arrangement. Furthermore, an unpatterned film may be applied, which is subsequently patterned to provide the desired shape of the solder stop coating 170. One of the procedures mentioned above, for example, exposure and development may be employed in this case.

Figure 8:
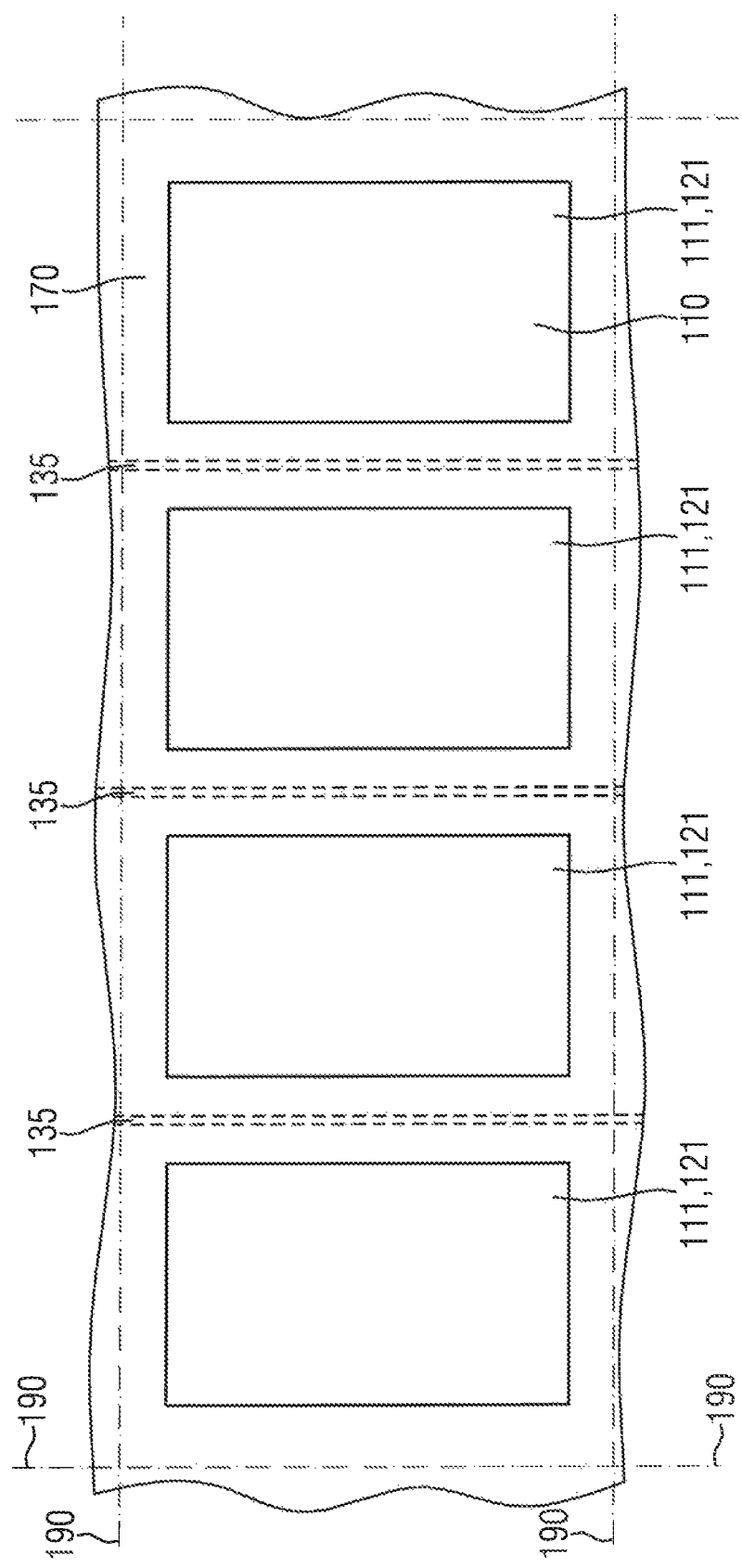
FIGS. 8 and 9 show steps of the method sequence in a rear-side view.
Figure 9:
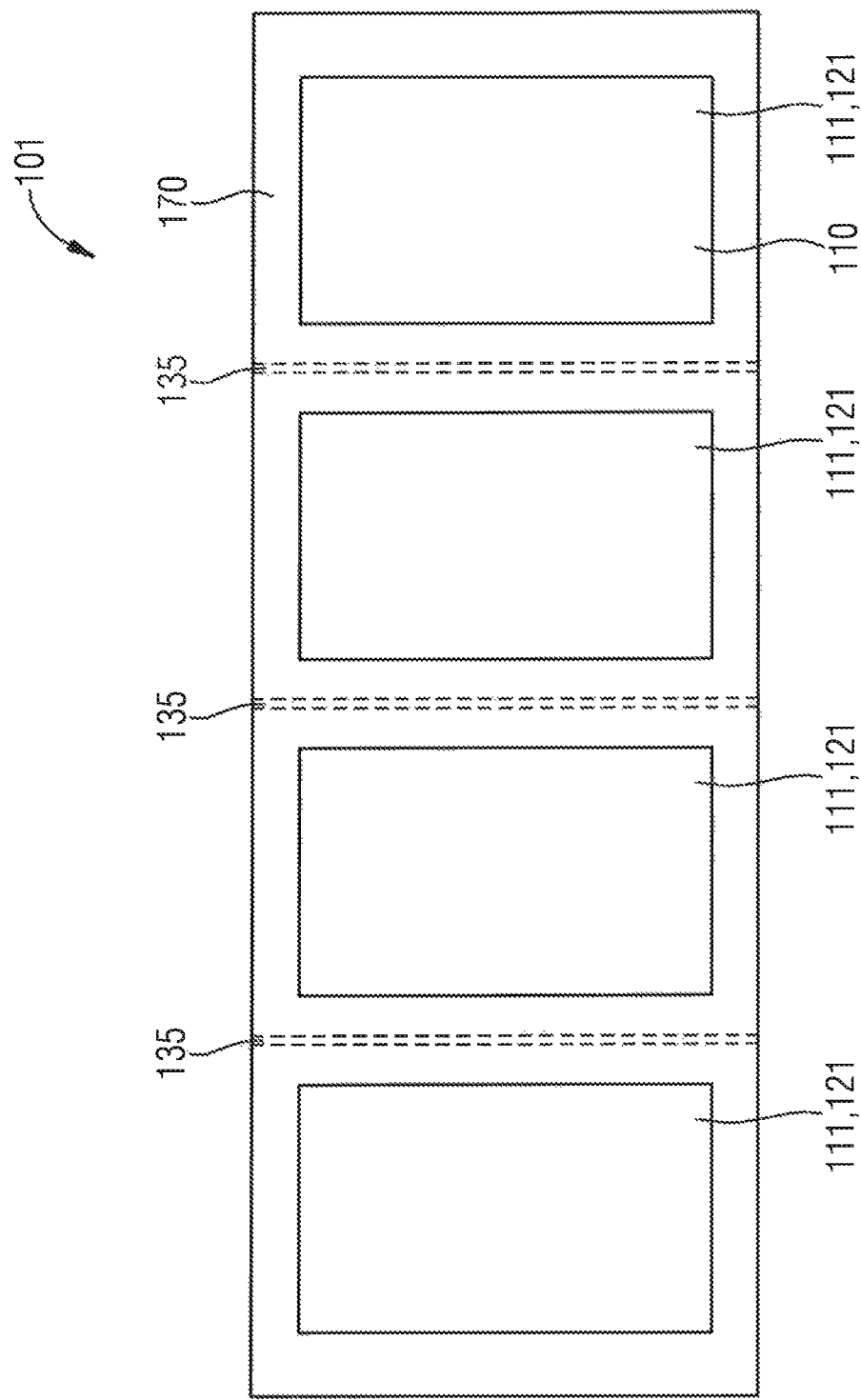

With regard to production of a plurality of multi-chip components 101 as an assemblage, the solder stop coating 170 is formed such that the grid shape continues beyond the region illustrated in FIG. 8, and thus each component 101 obtains the shown configuration comprising four connection regions 121 arranged alongside one another in a row.

The component assemblage present after applying the solder stop coating 170 is subsequently singulated. This process involves severing the housing material 160, the conductor structure 110 and the solder stop coating 170 along separating lines 190 as indicated in FIGS. 6 and 8. The severing may be carried out with the aid of a sawing process, for example. Separate multi-chip components 101 comprising the construction shown in FIG. 4 in cross section are provided as a result. Supplementarily, FIG. 7 illustrates a front-side view and FIG. 9 a rear-side view of a singulated component 101. The conductor sections 111 still assigned to a plurality of components 101 in the assemblage are severed during singulating, and thereby obtain their final shape shown in FIGS. 7 and 9.

The multi-chip component 101 produced in this way comprises three semiconductor chips 150 and a conductor structure 110 comprising four separate conductor sections 111 each comprising a rear-side connection pad 121. A respective semiconductor chip 150 or chip stack comprising semiconductor chip 150 and conversion element 155 is arranged on three conductor sections 111. With the aid of the conductor sections 111 and the bond wires 157, which respectively connect to a front-side contact of a semiconductor chip 150 and an adjacent conductor section 111, the semiconductor chips 150 electrically connect in series. A conductor section 111 that is an outer conductor section with respect to the row of conductor sections 111 and is arranged on the right in FIGS. 4 and 7 does not carry a semiconductor chip 150, and connects via a bond wire 157 to a front-side contact of a semiconductor chip 150 arranged on an adjacent conductor section 111.

The multi-chip component 101 is suitable for surface mounting (SMT, Surface Mounting Technology) by soldering. In this case, the four connection pads 121 of the component 101 may electrically connect (not illustrated) to connection pads of a further device, for example, of a circuit board via a solder.

Via the two outer connection pads 121, electrical energy used to generate radiation may be added to the multi-chip component 101 and thus to the semiconductor chips 150. As has been indicated above, the primary radiation of the semiconductor chips 150 may be at least partly converted with the aid of the conversion elements 155. The converted radiation including a non-converted radiation portion possibly present may be emitted from the exposed front sides of the conversion elements 155. The two inner connection pads 121 may be used to mechanically secure and dissipate heat from the component 101.

The solder stop coating 170 provides for a separation and thus a reliable electrical insulation of the connection pads 121, which may comprise a relatively large distance with respect to one another on account of the solder stop coating 170. As has been indicated above, the distance may be in the region of 300 µm. Consequently, in the course of surface mounting of the multi-chip component 101, it is possible reliably to prevent a plurality of connection pads 121 from being jointly wetted with a solder and thereby short-circuited.

In contrast thereto, the semiconductor chips 150 comprise a smaller distance, for example—as indicated above—in the region of 50 µm. This therefore correspondingly applies to the conversion elements 155 arranged on the semiconductor chips 150, from the front sides of which conversion elements the radiation is emitted during operation of the component 101. On account of the small distances, a radiation emission is possible with a high homogeneity.

Further advantages arise on account of the use of the metallic initial layer 130, which is patterned into the conductor structure 110 only after chip mounting and after applying the housing material 160. In this way, reliable chip mounting is possible, and it is possible to prevent the connection pads 121 from being contaminated on the rear side with housing material 160 during the process of applying same.

Furthermore, the possibility is afforded of using an initial layer 130 comprising a relatively small layer thickness. By way of example, a thickness of less than 150 µm, for example, 100 µm, is possible. In this case, the initial layer 130 may be a film. During a process of arranging the semiconductor chips 150 on the initial layer 130 by soldering, an occurrence of mechanical stress, caused by different coefficients of thermal expansion of the semiconductor chips 150 and the initial layer 130, may be kept small with the aid of the small layer thickness. In this way, a warpage of the semiconductor chips 150 (chip warpage) that is possibly present after the soldering process may be as small as possible or negligible. Consequently, there is only a low risk of detachment of the conversion elements 155 from the semiconductor chips 150 and a color locus shift (color shift) associated therewith.

Possible variants and modifications of the method explained with reference to FIGS. 1 to 9 are described below. Corresponding method steps and features and also identical and identically acting component parts will not be described in detail again below. For details in respect thereof, reference is instead made to the description above. Furthermore, aspects and details mentioned with regard to one method variant may also be applied with regard to another method variant and features of two or more configurations may be combined with one another.

One possible modification consists, for example, of forming separate conductor sections 111 by producing the cutouts 135 severing the initial layer 130, which conductor sections, with regard to fabrication of a plurality of multi-chip components 101 as an assemblage, are not assigned to a plurality of components 101, but rather only to the individual components 101. In this case, the cutouts 135 may be produced in the form of a continuous grid structure in regions alongside or between the semiconductor chips 150. The solder stop coating 170 may be formed in a manner coordinated therewith in the region of the cutouts 135 on the rear side of the relevant chip arrangement.

In a further example, a multi-chip component may be fabricated with a different number of semiconductor chips 150 or chip stacks. This is the case, for example, for the method sequences explained with reference to the following figures, in which multi-chip components are produced with two instead of three semiconductor chips 150. The methods described here may furthermore be carried out such that multi-chip components are formed with a greater number of semiconductor chips 150.

Figure 10:
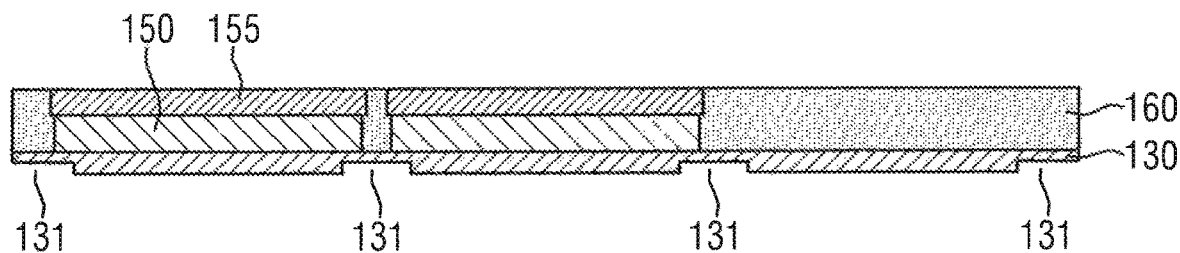
FIGS. 10 to 12 show a further method sequence of producing a multi-chip component on the basis of lateral sectional illustrations, wherein a metallic initial layer including rear-side depressions is used.

In a further example, a patterned metallic initial layer 130 comprising depressions is used. A method sequence carried out in this sense to produce a surface-mountable multi-chip component 102 is shown on the basis of lateral sectional illustrations in FIGS. 10 to 12. In this case, an initial layer 130 comprising rear-side depressions 131 is provided, and the initial layer 130 subsequently as shown in FIG. 10, is provided on the front side with chip stacks comprising a semiconductor chip 150 and a conversion element 155 and also with a housing material 160 enclosing the chip stacks.

The depressions 131 may be produced by an etching process using an etching or photoresist mask formed on the initial layer 130. The depressions 131 may comprise a depth of approximately half the magnitude of a thickness of the initial layer 130, and thus constitute half-etchings. Given a thickness of the initial layer 130 of 100 µm, the initial layer 130 may comprise a material thickness of approximately 50 µm in the region of the depressions 131.

The depressions 131, like cutouts 135 produced later, may be formed in a manner extending parallel to one another in one direction, that is to say perpendicularly to the plane of the drawing in FIGS. 10 to 12. With regard to production of a plurality of multi-chip components 102 as an assemblage, the depressions 131, like the cutouts 135 formed later as well, may extend over the regions of a plurality of the components 102 to be produced.

The chip mounting on the initial layer 130 provided with the depressions 131 is carried out such that the initial layer 130 is equipped with the semiconductor chips 150 in regions between depressions 131. As shown in FIG. 10, the semiconductor chips 150 may partly overlap the relevant depressions 131 at the edge. Furthermore, bond wires (not shown) connect to the initial layer 130 and front-side contacts of the semiconductor chips 150. After chip mounting, an arrangement comprising two chip stacks comparable to FIG. 5 may be present, as viewed from above.

With regard to production of a plurality of multi-chip components 102 as an assemblage, for each component 102, two chip stacks are provided on the initial layer 130. Afterward, the housing material 160 provided for all the components 102 is applied on the initial layer 130.

Figure 11:
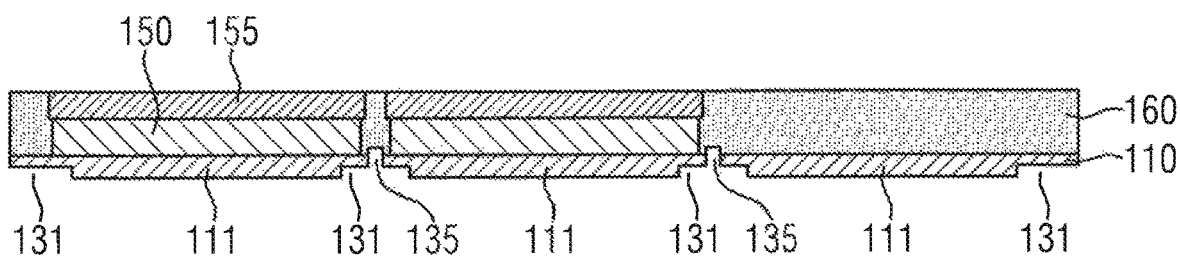

After applying the housing material 160, cutouts 135 are produced at the rear side of the relevant chip arrangement as shown in FIG. 11, the cutouts severing the initial layer 130. A conductor structure 110 comprising a plurality of conductor sections 111 is provided in this way. The cutouts 135 may extend in a direction parallel to one another and in regions alongside or between the semiconductor chips 150. Forming the cutouts 135 is carried out in the region of depressions 131 of the initial layer 130 as a result of which this step may be carried out simply and rapidly. The cutouts 135 are formed with a smaller width compared to the depressions 131. Moreover, the cutouts 135 as shown in FIG. 11 may each be formed in the center of the associated depressions 131. The conductor sections 111 constituted by producing the cutouts 131 may initially still be assigned to a plurality of components 102.

Figure 12:
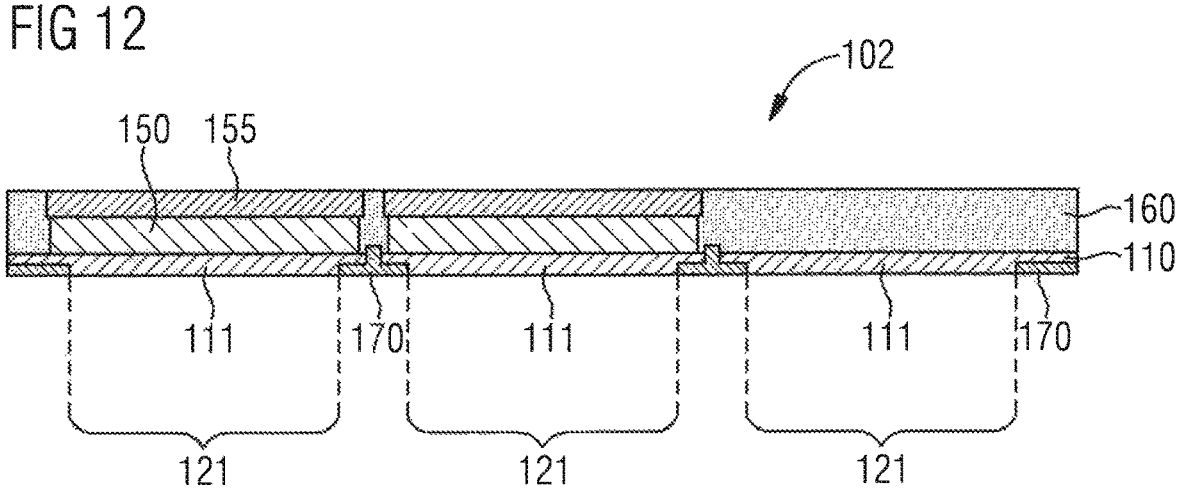

The chip arrangement present after producing the cutouts 135 is subsequently provided with a solder stop coating 170 on the rear side as shown in FIG. 12. The solder stop coating 170 may comprise a grid shape and enclose in a rear-side view exposed connection regions 121 of the conductor sections 111 of the conductor structure 110. A configuration comprising three connection regions 121 arranged alongside one another in a row is provided for the multi-chip component 102. In this sense a structure comprising three connection regions 121 comparable to FIG. 8 may be present, as viewed from below.

The solder stop coating 170 is formed in the region of the depressions 131 and cutouts 135 such that these, as shown in FIG. 12, are filled with the solder stop coating 170. At these locations, the solder stop coating 170 may terminate flush with the connection pads 121. On account of the grid shape, applying the solder stop coating 170 on the conductor structure 110 may also be carried out in other regions outside and between the depressions 131 and cutouts 135. The solder stop coating 170 covers a part of the conductor structure 110 such that shapes and distances of the rear-side connection regions 121 are defined with the aid of the solder stop coating 170. As shown in FIG. 12, distances between the connection regions 121 greater than distances between the semiconductor chips 150 may be realized.

With regard to production of a plurality of multi-chip components 102 as an assemblage, the solder stop coating 170 may be formed in a manner extending over all the components 102 to be produced such that each component 102 obtains a configuration comprising three connection regions 121. Furthermore, the component assemblage present after applying the solder stop coating 170 is singulated as a result of which separate multi-chip components 102 comprising the construction shown in FIG. 12 are provided. The conductor sections 111 still assigned to a plurality of components 102 in the assemblage may be severed during singulating.

The multi-chip component 102 produced in this way comprises two semiconductor chips 150 and a conductor structure 110 comprising three separate conductor sections 111 each comprising a rear-side connection pad 121. A structure comparable to FIG. 7 may be present as viewed from above, and a structure comparable to FIG. 9 may be present as viewed from below. In the component 102, a respective semiconductor chip 150 or chip stack is arranged on two conductor sections 111. With the aid of the conductor sections 111 and the bond wires (not shown in FIG. 12) respectively connected to a front-side contact of a semiconductor chip 150 and to an adjacent conductor section 111, the semiconductor chips 150 electrically connect in series. An outer conductor section 111 arranged on the right in FIG. 12 does not carry a semiconductor chip 150 and connects via a bond wire to a front-side contact of a semiconductor chip 150 arranged on an adjacent conductor section 111.

In one modification of the method sequence explained above, the solder stop coating 170 may be formed such that the solder stop coating 170 in the region of the depressions 131, in a departure from FIG. 12, is also located laterally with respect to the depressions 131 on the conductor structure 110.

A further modification consists of producing the cutouts 135 in the form of a continuous grid structure such that, with regard to fabrication of a plurality of multi-chip components 102 as an assemblage, separate conductor sections 111 assigned to the individual components 102 are constituted. For the depressions 131, a configuration in the form of a corresponding grid structure may be provided, as a result of which the cutouts 135 may be produced in a simple manner in the region of depressions 131. The solder stop coating 170 may be formed in a manner coordinated therewith in the region of the depressions 131 and cutouts 135 on the rear side of the relevant chip arrangement.

Figure 13:
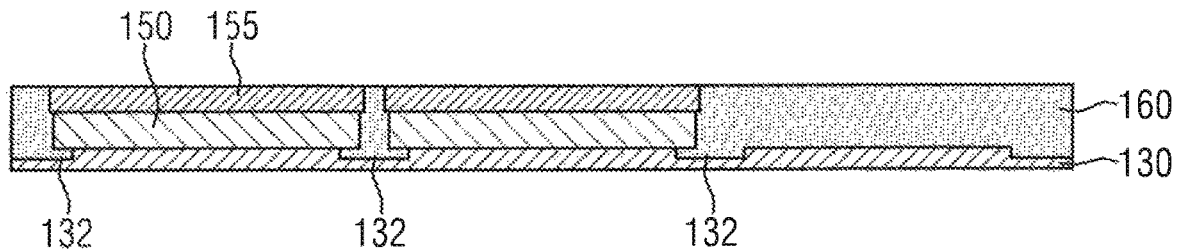
FIGS. 13 to 15 show a further method sequence of producing a multi-chip component on the basis of lateral sectional illustrations, wherein a metallic initial layer comprising front-side depressions is used.
Figure 14:
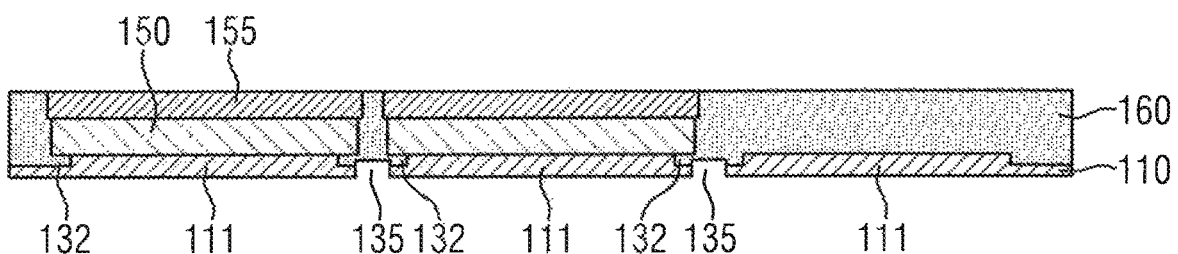
Figure 15:
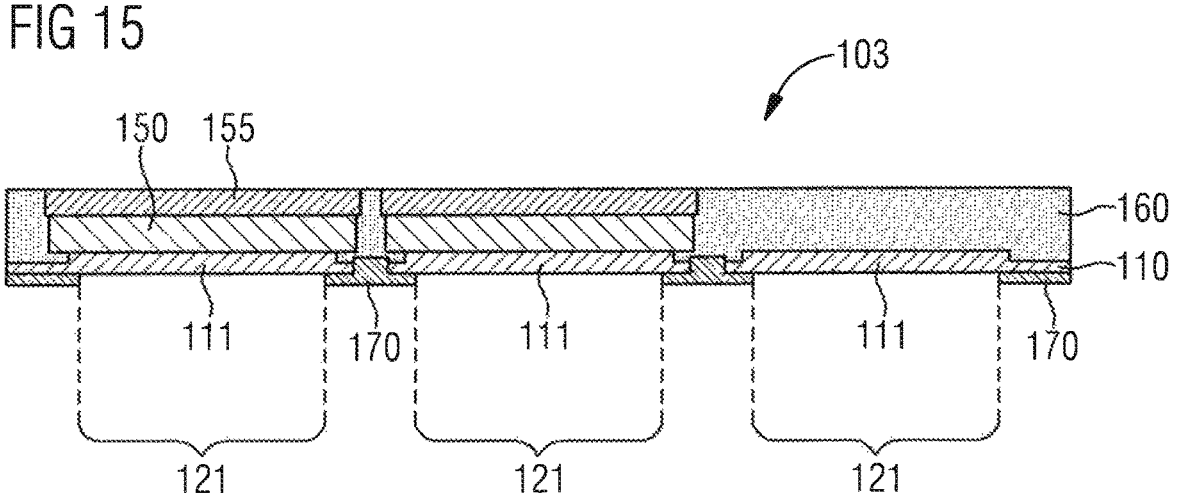

FIGS. 13 to 15 show, on the basis of lateral sectional illustrations, a further method sequence of producing a surface-mountable multi-chip component 103. In this case, a metallic initial layer 130 comprising front-side depressions 132 is provided, and the initial layer 130 subsequently as shown in FIG. 13 is provided on the front side with chip stacks comprising a semiconductor chip 150 and a conversion element 155 and also with a housing material 160 enclosing the chip stacks.

The front-side depressions 132 may be produced by an etching process using an etching mask formed on the initial layer 130, and may be half-etchings. Given a thickness of the initial layer 130 of 100 μm, the initial layer 130 may comprise a material thickness of 50 μm in the region of the depressions 132. Furthermore, the depressions 132, like cutouts 135 produced later, may be formed in a manner extending parallel to one another in one direction, that is to say perpendicularly to the plane of the drawing in FIGS. 13 to 15. With regard to production of a plurality of multi-chip components 103 as an assemblage, the depressions 132, like the cutouts 135 formed later as well, may extend over the regions of a plurality of the components 103 to be produced.

The chip mounting on the initial layer 130 comprising the depressions 132 is carried out such that the initial layer 130 is equipped with the semiconductor chips 150 in regions between depressions 132. As shown in FIG. 13, the semiconductor chips 150 may partly overlap the relevant depressions 132 at the edge. Furthermore, bond wires (not shown) connect to the initial layer 130 and front-side contacts of the semiconductor chips 150. After chip mounting, an arrangement comprising two chip stacks comparable to FIG. 5 may be present, as viewed from above.

With regard to the fabrication as an assemblage, before applying the housing material 160 for each component 103 to be produced, two chip stacks are provided on the initial layer 130.

Afterward, cutouts 135 are produced at the rear side of the chip arrangement as shown in FIG. 14, the cutouts severing the initial layer 130. A conductor structure 110 comprising a plurality of conductor sections 111 is provided in this way. The cutouts 135 may extend in a direction parallel to one another and in regions alongside or between the semiconductor chips 150. The cutouts 135 are formed in a simple manner in the region of depressions 132 of the initial layer 130, and with a smaller width compared to the depressions 132. The cutouts 135 may be fabricated with a width that exceeds the chip-to-chip distance. Moreover, the cutouts 135 as shown in FIG. 11, may be formed centrally with respect to the associated depressions 132. The conductor sections 111 constituted by producing the cutouts 135 may initially still be assigned to a plurality of components 103.

Afterward, a solder stop coating 170 is formed on the rear side of the chip arrangement as shown in FIG. 15. The solder stop coating 170 may comprise a grid shape, and enclose in a rear-side view exposed connection regions 121 of the conductor sections 111 of the conductor structure 110. A configuration comprising three connection regions 121 arranged alongside one another in a row is provided for the multi-chip component 103. In this sense a structure comprising three connection regions 121 comparable to FIG. 8 may be present, as viewed from below.

The solder stop coating 170 is formed in the region of the cutouts 135 such that the latter are filled with the solder stop coating 170. The conductor structure 110 is also covered with the solder stop coating 170 laterally with respect to the cutouts 135, and in regions outside and between the cutouts 135. Shapes and distances of the rear-side connection regions 121 are defined with the aid of the solder stop coating 170 partly covering the conductor structure 110. As shown in FIG. 15, distances between the connection regions 121 greater than distances between the semiconductor chips 150 may be realized.

With regard to production of a plurality of multi-chip components 103 as an assemblage, the solder stop coating 170 may be formed in a manner extending over all the components 103 to be produced. Afterward, the component assemblage is singulated as a result of which separate multi-chip components 103 comprising the construction shown in FIG. 15 are provided. The conductor sections 111 still assigned to a plurality of components 103 in the assemblage may be severed during this process.

The multi-chip component 103 produced in this way, like the component 102 explained above, comprises two semiconductor chips 150 and a conductor structure 110 comprising three separate conductor sections 111 each comprising a rear-side connection pad 121. A structure comparable to FIG. 7 may be present as viewed from above, and a structure comparable to FIG. 9 may be present as viewed from below. The semiconductor chips 150 electrically connect in series with the aid of the conductor sections 111 and the bond wires (not shown in FIG. 15).

One possible modification of the method sequence explained above consists of producing the cutouts 135 in the form of a continuous grid structure such that, with regard to the fabrication of a plurality of multi-chip components 103 as an assemblage, separate conductor sections 111 assigned to the individual components 103 are constituted. A configuration in the form of a corresponding grid structure may be provided for the depressions 132 as a result of which the cutouts 135 may be produced in the region of depressions 132. The solder stop coating 170 may be formed in a manner coordinated therewith in the region of the cutouts 135 on the rear side of the relevant chip arrangement.

Figure 16:
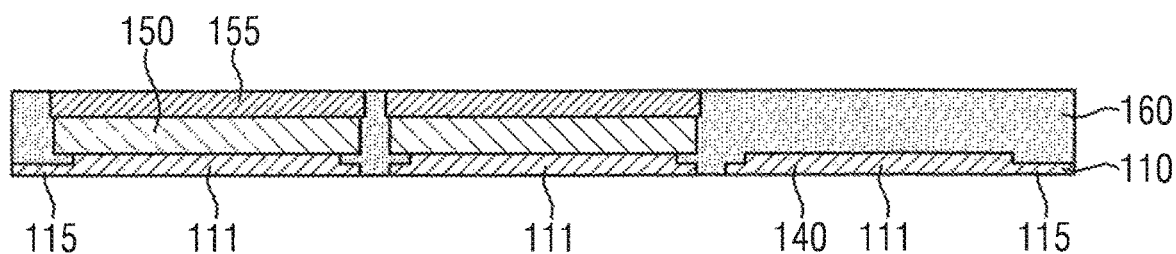
FIGS. 16 and 17 show a further method sequence of producing a multi-chip component on the basis of lateral sectional illustrations, wherein a leadframe is used.
Figure 17:
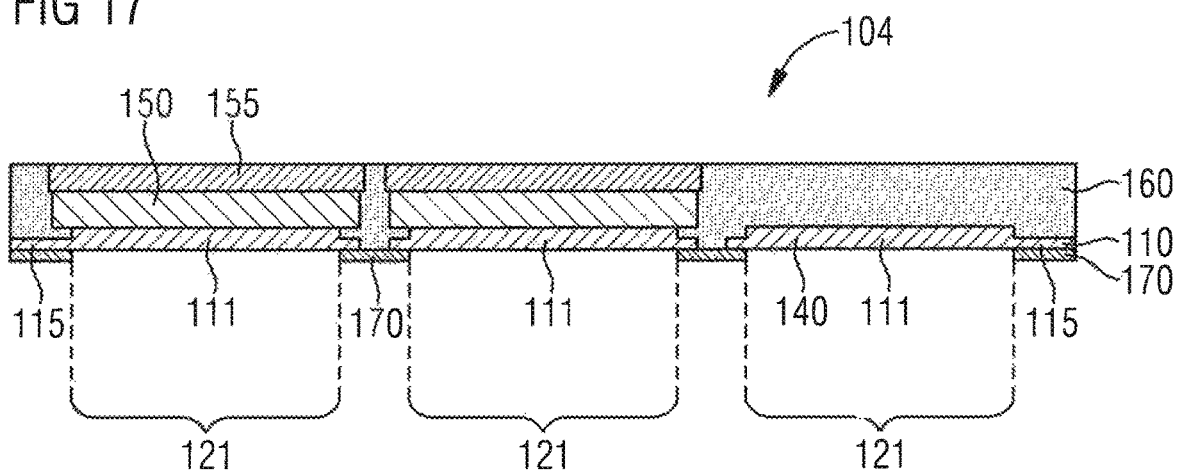

FIGS. 16 and 17 show a further method sequence of producing a surface-mountable multi-chip component 104 on the basis of lateral sectional illustrations. In this case, a patterned metallic leadframe 140 is provided, which subsequently as shown in FIG. 16 provided on the front side with chip stacks comprising a semiconductor chip 150 and a conversion element 155 and with a housing material 160 enclosing the chip stacks.

The leadframe 140 already constitutes a corresponding conductor structure 110 of the chip arrangement shown in FIG. 16. The leadframe 140 comprises conductor sections 111 and connection webs 115 connecting the conductor sections 111. With regard to the production of a plurality of multi-chip components 104 as an assemblage, the leadframe 140 comprises for each component 104 three conductor sections 111 arranged alongside one another in a row, wherein two of the conductor sections 111 in each case are equipped with a chip stack. Only the conductor sections 111 of different components 104 to be fabricated are connected via the connection webs 115.

In the context of chip mounting, semiconductor chips 150 are arranged by the rear-side contacts thereof on conductor sections 111, for example, by soldering or adhesive bonding. Furthermore, bond wires (not illustrated) connected to front-side contacts of the semiconductor chips 150 and to conductor sections 111 adjacent to the conductor sections 111 carrying the semiconductor chips 150, such that a series connection of two semiconductor chips 150 comparable to FIG. 7 may be realized for each component 104. Before or after connecting the bond wires, conversion elements 155 are arranged on the semiconductor chips 150.

Subsequently applying the housing material 160 may be carried out by a transfer molding process. In this case, the leadframe 140 provided with the chip stacks is received in a corresponding transfer molding tool and encapsulated with the housing material 160 by molding such that the housing material 160 encloses the chip stacks in a manner extending as far as the front sides thereof. The housing material 160 is also arranged in regions laterally with respect to the conductor sections 111 and between the conductor sections 111. A film assisted transfer molding process may be carried out, in which a tool part with a film is pressed onto the chip stacks.

The chip arrangement present after applying the housing material 160 is subsequently provided with a solder stop coating 170 on the rear side as shown in FIG. 17. This is carried out such that the leadframe 140 or the conductor sections 111 is/are partly covered with the solder stop coating 170. The solder stop coating 170 may each comprise a grid shape and enclose in a rear-side view an exposed connection region 121 of each of the conductor sections 111. A configuration comprising three connection regions 121 arranged alongside one another in a row is provided for the multi-chip component 104.

The solder stop coating 170 covers a part of the leadframe 140 such that shapes and distances of the rear-side connection regions 121 are defined with the aid of the solder stop coating 170. As shown in FIG. 17, distances between the connection regions 121 greater than distances between the semiconductor chips 150 may be realized.

With regard to the production of a plurality of multi-chip components 104 as an assemblage, the solder stop coating 170 may be formed in a manner extending over all the components 104 to be produced such that each component 104 obtains a configuration comprising three connection regions 121. Furthermore, the component assemblage present after applying the solder stop coating 170 is singulated as a result of which separate multi-chip components 104 comprising the construction shown in FIG. 17 are provided. In the context of singulating the component assemblage, the connection webs 115 of the leadframe 140 are severed such that the conductor sections 111 of the individual components 104 are no longer connected by material of the leadframe 140 and are no longer short-circuited as a result.

The multi-chip component 104 produced in this way comprises, in a manner comparable to the components 102, 103 explained above, two semiconductor chips 150 and three separate conductor sections 111 each comprising a rear-side connection pad 121, wherein a respective semiconductor chip 150 is arranged on two conductor sections 111. With the aid of the conductor sections 111 and the bond wires (not shown in FIG. 17) respectively connected to a front-side contact of a semiconductor chip 150 and to an adjacent conductor section 111, the semiconductor chips 150 electrically connect in series.

Figure 18:
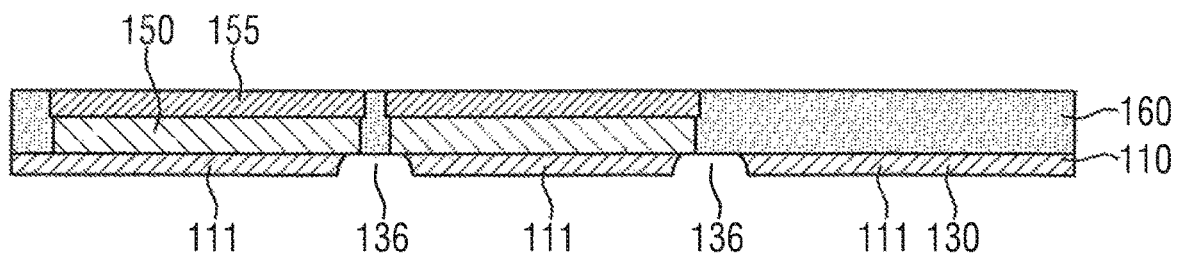
FIGS. 18 and 19 show a further method sequence of producing a multi-chip component on the basis of lateral sectional illustrations, wherein a metallic initial layer is used and cutouts are produced in the initial layer, through which semiconductor chips are exposed at a rear side.
Figure 19:
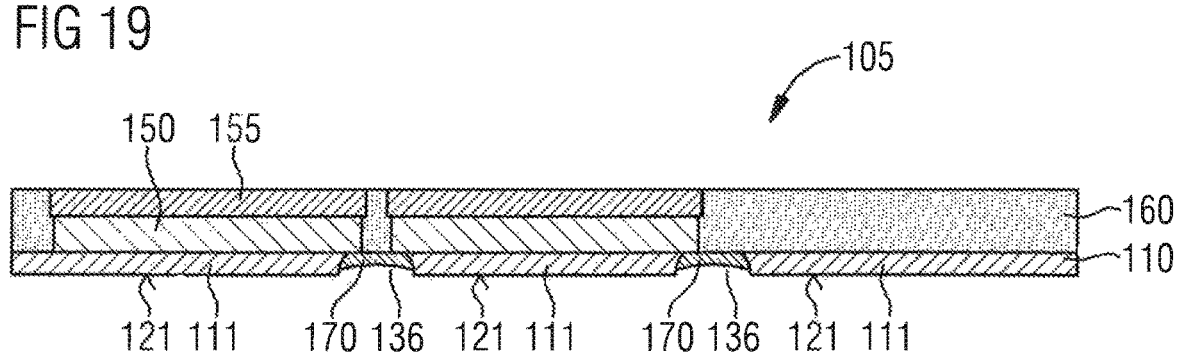

FIGS. 18 and 19 show a further method sequence of producing a surface-mountable multi-chip component 105 on the basis of lateral sectional illustrations. In this case, in a manner comparable to the method sequence in FIGS. 1 to 4, a metallic initial layer 130 is provided, which subsequently, as shown in FIG. 18, is provided on the front side with chip stacks comprising a semiconductor chip 150 and a conversion element 155 and with a housing material 160 enclosing the chip stacks. In the context of chip mounting, bond wires (not shown) connect to the initial layer 130 and front-side contacts of the semiconductor chips 150. After chip mounting, an arrangement comprising two chip stacks comparable to FIG. 5 may be present, as viewed from above. With regard to the fabrication of a plurality of multi-chip components 105 as an assemblage, for each component 105 two chip stacks are provided on the initial layer 130.

Afterward, cutouts 136 are formed at the rear side, as likewise shown in FIG. 18, the cutouts severing the initial layer 130. A conductor structure 110 comprising a plurality of conductor sections 111 is provided in this way. The cutouts 136 may extend in a direction parallel to one another and in regions alongside or between the semiconductor chips 150. The cutouts 136 may be produced by etching on the rear side using an etching mask formed beforehand on the initial layer 130. The conductor sections 111 constituted by producing the cutouts 136 may initially still be assigned to a plurality of components 103.

The cutouts 136 are formed with a larger width compared to the cutouts 135. Moreover, this step is carried out such that the rear sides of the semiconductor chips 150 as shown in FIG. 16 are partly exposed at the edge.

Afterward, a solder stop coating 170 is formed on the rear side of the chip arrangement as shown in FIG. 19. The solder stop coating 170 is formed in the region of the cutouts 136 such that the cutouts 136 are filled with the solder stop coating 170 and the previously exposed rear-side partial regions of the semiconductor chips 150 are covered. The solder stop coating 170 brings about a separation of rear-side connection regions 121 of the conductor sections 111 of the conductor structure 110. In this case, the distances between the connection regions 121, at least in the cross section shown in FIG. 19 and in which the solder stop coating 170 is arranged only within the cutouts 136, may be defined by the etched-back cutouts 136.

The solder stop coating 170 may comprise a grid shape such that the connection regions 121 may be enclosed by the solder stop coating 170 in a rear-side view. In this case, the solder stop coating 170 may in places also be arranged outside the cutouts 136 on the conductor structure 110. A configuration comprising three connection regions 121 arranged alongside one another in a row is provided for the multi-chip component 105. In this sense a structure comparable to FIG. 8 may be present as viewed from below.

With regard to production of a plurality of multi-chip components 105 as an assemblage, the solder stop coating 170 may be formed in a manner extending over all the components 105 to be produced. Afterward, the component assemblage is singulated, as a result of which separate multi-chip components 105 comprising the construction shown in FIG. 19 are provided. The conductor sections 111 still assigned to a plurality of components 105 in the assemblage may be severed during this process.

The multi-chip component 105 produced in this way comprises two semiconductor chips 150 and a conductor structure 110 comprising three separate conductor sections 111 each comprising a rear-side connection pad 121. A structure comparable to FIG. 7 may be present as viewed from above, and a structure comparable to FIG. 9 may be present as viewed from below. The semiconductor chips 150 electrically connect in series with the aid of the conductor sections 111 and the bond wires (not shown in FIG. 19).

One possible modification of the method sequence explained above consists of producing the cutouts 136 in the form of a continuous grid structure such that, with regard to the fabrication of a plurality of multi-chip components 105 as an assemblage, separate conductor sections 111 assigned to the individual components 105 are constituted. The solder stop coating 170 may be formed in a manner coordinated therewith in the region of the cutouts 136 or only within the cutouts 136 on the rear side of the relevant chip arrangement.

The structures explained with reference to the figures constitute preferred or examples. Besides the examples described and depicted, further examples are possible which may comprise further modifications and/or combinations of features. It is possible, for example, to use other materials instead of the materials indicated above.

A further variant consists, for example, of forming, instead of a grid-shaped solder stop coating 170, a solder stop coating 170 on the rear side of a chip arrangement provided comprising a plurality of separate partial sections. With regard to the method sequence explained with reference to FIGS. 1 to 9, the solder stop coating 170 may be realized, for example, in the form of strip-shaped partial sections extending parallel to one another in one direction. The partial sections of the solder stop coating 170 may, in a manner coordinated with the cutouts 135 extending parallel, be formed in the region of the cutouts 135. With regard to production of a plurality of multi-chip components as an assemblage, the partial sections of the solder stop coating 170 may extend over a plurality of components, and the partial sections may be severed during singulating. A multi-chip component produced in this way may comprise a solder stop coating 170 comprising separate partial sections, wherein the partial sections of the solder stop coating 170 are arranged between rear-side connection regions 121 and separate the latter.

The abovementioned modification may correspondingly be applied to the method sequences explained with reference to the other figures. With regard to the method in FIGS. 18 and 19, such partial sections of the solder stop coating 170 may be formed only within the cutouts 136 to fill the cutouts 136.

In a further variant, applying a housing material 160 on an initial layer 130 provided with chip stacks may be carried out by potting. In this configuration, the housing material 160 may be referred to as potting material 160. In this case, before or after chip mounting, a frame may be formed on the initial layer 130, and the region enclosed by the frame may be filled with the potting material 160 by potting. In this way, the potting material 160 may be formed in a manner adjoining the chip stacks and extending as far as the front sides thereof.

Furthermore, multi-chip components comprising numbers, geometric arrangements and/or shapes of connection regions 121 and semiconductor chips 150 that deviate from the figures and the description above may be fabricated.

Instead of semiconductor chips 150 comprising a front-side contact and a rear-side contact, other designs of semiconductor chips may be used. These include semiconductor chips comprising only front-side contacts or semiconductor chips comprising only rear-side contacts. With the use of such semiconductor chips, conductor structures 110 adapted thereto may be used or produced.

Furthermore, other semiconductor chips, for example, radiation receiving semiconductor chips may be used alongside radiation emitting semiconductor chips. Moreover, it is possible to use not just optoelectronic semiconductor chips, but other types of semiconductor chips.

A further variant is production of multi-chip components comprising different chip types. By way of example, a hybrid multi-chip component may be fabricated which comprises a (at least one) radiation emitting semiconductor chip and a (at least one) radiation receiving semiconductor chip.

Although our components and methods have been more specifically illustrated and described in detail by preferred examples, nevertheless this disclosure is not restricted by the examples disclosed and other variations may be derived therefrom by those skilled in the art, without departing from the scope of protection of the appended claims.

This application claims priority of DE 10 2016 101 526.1, the subject matter of which is incorporated herein by reference.

The invention claimed is:

1. A method of producing a surface-mountable multi-chip component comprising:
    providing a chip arrangement comprising a metallic conductor structure exposed at a rear side of the chip arrangement, a plurality of semiconductor chips and a housing material; and
    forming a solder stop coating on the rear side of the chip arrangement, wherein the solder stop coating separates connection regions of the conductor structure, wherein providing the chip arrangement comprises:
providing a metallic initial layer;
arranging the semiconductor chips on the initial layer;
applying the housing material on the initial layer; and
forming the conductor structure after arranging the semiconductor chips and applying the housing material by producing cutouts severing the initial layer, and
wherein the initial layer comprises depressions at a front side or at a rear side of the initial layer, and
the cutouts for forming the conductor structure are produced in a region of the depressions.

2. The method according to claim 1, wherein the initial layer comprises a thickness of less than 150 μm.

3. The method according to claim 1, wherein the rear side of the chip arrangement during the process of forming the solder stop coating is covered with the solder stop coating at least in a region of the cutouts.

4. The method according to claim 1, wherein rear sides of semiconductor chips are exposed in a partial region by producing the cutouts and are subsequently covered with the solder stop coating.

5. The method according to claim 1, wherein providing the chip arrangement comprises:
providing a metallic leadframe, which constitutes the conductor structure;
arranging the semiconductor chips on the leadframe; and
applying the housing material on the leadframe.

6. The method according to claim 1, wherein the conductor structure is partly covered with the solder stop coating during the process of forming the solder stop coating.

7. The method according to claim 1, wherein the solder stop coating is formed with a shape enclosing the connection regions.

8. The method according to claim 1, comprising at least one of:
the semiconductor chips are optoelectronic semiconductor chips; and
providing the chip arrangement is carried out such that the housing material is arranged on the conductor structure and adjoins the semiconductor chips.

9. The method according to claim 1, wherein the multi-chip component is produced such that the connection regions comprise a distance of more than 100 μm and the semiconductor chips comprise a distance of less than 100 μm.

10. The method according to claim 1, wherein the connection regions are exposed surface regions of the conductor structure.

11. The method according to claim 1, wherein the cutouts are produced such that a width of the cutouts is smaller than a width of the depressions.

12. The method according to claim 1, wherein the cutouts are formed centrally with respect to the depressions.

13. The method according to claim 1, comprising at least one of:
the depressions are formed in a manner extending parallel to one another; and
the cutouts are formed in a manner extending parallel to one another.

14. The method according to claim 1, comprising at least one of:
the depressions are configured in the form of a continuous grid structure; and
the cutouts are produced in the form of a continuous grid structure.

15. A surface-mountable multi-chip component comprising a conductor structure accessible at a rear side of the multi-chip component, a plurality of semiconductor chips, a housing material and a solder stop coating formed at the rear side of the multi-chip component, wherein the solder stop coating separates connection regions of the conductor structure,
the plurality of semiconductor chips is arranged on a front side of the conductor structure,
the conductor structure comprises depressions at the front side of the conductor structure,
the conductor structure comprises separate conductor sections, between which cutouts are located,
the cutouts are formed at a rear side, opposite to the front side, of the conductor structure and in a region of the depressions of the conductor structure, and
a width of the cutouts is smaller than a width of the depressions.

16. The surface-mountable multi-chip component according to claim 15, wherein the connection regions comprise a distance of more than 100 μm and the semiconductor chips comprise a distance of less than 100 μm.

17. The surface-mountable multi-chip component according to claim 15, wherein the connection regions are exposed surface regions of the conductor structure.

18. A method of producing a surface-mountable multi-chip component comprising:
providing a chip arrangement comprising a metallic conductor structure exposed at a rear side of the chip arrangement, a plurality of semiconductor chips and an housing material; and
forming a solder stop coating on the rear side of the chip arrangement, wherein the solder stop coating separates connection regions of the conductor structure,
wherein
providing the chip arrangement comprises:
providing a metallic initial layer comprising depressions at a front side of the initial layer;
arranging the semiconductor chips on the front side of the initial layer;
applying the housing material on the front side of the initial layer; and
forming the conductor structure after arranging the semiconductor chips and applying the housing material by producing cutouts severing the initial layer, and
wherein the cutouts for forming the conductor structure are produced at a rear side, opposite to the front side, of the initial layer and in a region of the depressions.

19. The method according to claim 18, wherein the cutouts are produced such that a width of the cutouts is smaller than a width of the depressions.

20. The method according to claim 18, wherein the cutouts are produced with a width that exceeds a chip-to-chip distance between the semiconductor chips.

* * * * *